United States Patent
Witte et al.

(10) Patent No.: US 9,447,604 B2
(45) Date of Patent: Sep. 20, 2016

(54) VEHICLE DOOR HANDLE WITH CAPACITIVE PROXIMITY SENSOR

(71) Applicant: HUF HÜLSBECK & FÜRST GMBH & CO. KG, Velbert (DE)

(72) Inventors: Martin Witte, Ahaus (DE); Andreas Peschl, Velbert (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 75 days.

(21) Appl. No.: 14/380,711

(22) PCT Filed: Feb. 25, 2013

(86) PCT No.: PCT/EP2013/053697
§ 371 (c)(1),
(2) Date: Aug. 23, 2014

(87) PCT Pub. No.: WO2013/131770
PCT Pub. Date: Sep. 12, 2013

(65) Prior Publication Data
US 2015/0091311 A1    Apr. 2, 2015

(30) Foreign Application Priority Data
Mar. 6, 2012 (DE) .......................... 10 2012 101 882

(51) Int. Cl.
*E05B 3/00* (2006.01)
*E05B 17/22* (2006.01)
(Continued)

(52) U.S. Cl.
CPC .................. *E05B 17/22* (2013.01); *E05B 7/00* (2013.01); *E05B 65/10* (2013.01); *E05B 77/34* (2013.01);
(Continued)

(58) Field of Classification Search
CPC ....................................................... E05B 81/77

USPC ....................................................... 292/336.3
See application file for complete search history.

(56) References Cited

U.S. PATENT DOCUMENTS 5,730,165 A    3/1998  Philipp
7,394,368 B2 *  7/2008  Richards .................... 340/545.3
(Continued)

FOREIGN PATENT DOCUMENTS

CN    101084355 A    12/2007
CN    101680773 A    3/2010
(Continued)

OTHER PUBLICATIONS

International Preliminary Report on Patentability and Written Opinion of International Application No. PCT/EP2013/053697 dated Sep. 18, 2014 and English Translation, 19 pages.
(Continued)

*Primary Examiner* — Mark Williams
(74) *Attorney, Agent, or Firm* — Fay Sharpe LLP

(57) ABSTRACT

A door handle for motor vehicles includes a handle body and a cover which cooperate to form a handle for a user. An accommodating space for electronic components is formed between the handle body and the cover. A capacitive proximity sensor is arranged in the space. The sensor has an active capacitive face directed towards the cover for detecting approaching movements. The capacitive face is coupled to an evaluation circuit which detects changes in the capacitance of the capacitive face. A sealing element composed of a closed-cell foam is located in the space. The sealing element has at least one continuous opening spaced from an edge. The opening is located above the active face of the proximity sensor and is compressed between the cover and the handle body with the result that at least one area above the active face of the sensor is free of foam.

11 Claims, 3 Drawing Sheets

(51) Int. Cl.
*E05B 77/34* (2014.01)
*H03K 17/955* (2006.01)
*E05B 7/00* (2006.01)
*E05B 65/10* (2006.01)
*E05B 81/78* (2014.01)
*E05B 85/16* (2014.01)

(52) U.S. Cl.
CPC ............. E05B 81/77 (2013.01); H03K 17/955 (2013.01); *E05B 81/78* (2013.01); *E05B 85/16* (2013.01); *Y10T 292/57* (2015.04)

(56) References Cited

U.S. PATENT DOCUMENTS

2003/0216817 A1* 11/2003 Pudney .......................... 700/17
2005/0136697 A1   6/2005 Fukunaga et al.
2005/0236846 A1   10/2005 Hidaka et al.
2007/0227203 A1* 10/2007 Weber .............................. 70/91

FOREIGN PATENT DOCUMENTS

| CN | 102325951 A | 1/2012 |
| DE | 10 2004 019 627 A1 | 12/2004 |
| DE | 196 81 725 B4 | 4/2007 |
| DE | 10 2005 061 755 A1 | 6/2007 |
| EP | 1 349 280 A1 | 10/2003 |
| JP | 2010100993 A | 5/2010 |
| WO | WO 2008/107046 A1 | 9/2008 |

OTHER PUBLICATIONS

International Search Report of International Application No. PCT/EP2013/053697 dated May 14, 2013, 6 pages.

* cited by examiner

VEHICLE DOOR HANDLE WITH CAPACITIVE PROXIMITY SENSOR

BACKGROUND

The invention relates to a door actuation arrangement with sensor means for detecting the approaching movement of a user. In particular the invention relates to door handle systems with capacitive proximity sensors.

Such capacitive sensor systems are well known in technology and can detect the approaching movement of a user in a non-contacting manner. To this end the change of the capacity of an electrode arrangement is measured, which among other things is dependent on the proximity of the body part of a user. An exemplary arrangement can be learned from DE102005061755A1.

Such sensor systems are used in the state of the art for "passive entry" systems, in which case the user no longer needs to actively actuate a button of a radio remote control for access to a vehicle. Instead, it is sufficient that the user carries the designated radio remote control as an ID transmitter (identification transmitter) on his person (for example, in a pocket of the clothing or briefcase). In this connection, the proximity of the user to the door of the motor vehicle is detected by means of a proximity sensor, whereupon a controller arranged in the motor vehicle sends a radio signal via a transmitting antenna (for example arranged in a door handle) to the ID transmitter located on the person of the user, that the ID transmitter should "wake up". Upon receipt of the wake-up signal a radio dialog begins between the ID transmitter and the controller of the motor vehicle, in whose result the authorization or non-authorization of the ID transmitter is established. If the authorization of the ID transmitter is established, the door lock is unlocked, so that the door lock can be opened by a subsequent actuation of the door handle. For example, one of the mentioned capacitive sensors is used as an approximation sensor.

In other respects, it is known that such sensor arrangements are dependent on the weather and dependent on other environmental conditions. The humidity, precipitation and other influences likewise change the capacity of the sensor system.

In the case of the use of a capacitive sensor for detection of the approaching movement of a user, it is therefore problematic to establish without a doubt the approaching movement of an operator body part, for example, a hand to the door handle for the purpose of opening the door in the event of such disturbing influences.

Door handle systems in which capacitive proximity sensors are integrated that are protected from environmental influences are known in the prior art. For example, EP 03 100 728.9 discloses a system which arranges a capacitive sensor arrangement behind a housing wall. The space between the sensor arrangement and the housing wall is filled with an electrically insulating material in order to prevent the entry of moisture or other foreign substances.

In particular, the influence of disturbing effects in the proximity of the electrodes of a capacitive sensor is to be prevented at all costs. Capacitive sensors can therefore be embedded in particular in sealing compounds in order to prevent a direct influence of the sensor surfaces. The above prior art in addition fills the entire space between such a cast electrode arrangement and a wall of a door handle with insulating material.

However, the disadvantage of the system is the fact that the influence of this material, even if it deters even more damaging influences from the detection range, is detrimental to the detection sensitivity. Even if the material is an electrically insulating material, it is nevertheless a dielectric influencing the capacity.

In other respects, the handle arrangement is subject to drastically changing environmental conditions and environmental temperatures, so that in the case of the solutions according to the prior art, due to changes in size gaps occur on a regular basis, said gaps into which substances can still penetrate or in which a condensation of fluid takes place.

The problem addressed by the invention is that of providing a fluid- and condensation-independent sensor device that has improved detection sensitivity.

BRIEF SUMMARY

According to the invention a door handle device for motor vehicles has a handle body and a cover for the handle body, wherein the handle body and the cover form a handle for a user.

An accommodating space for accommodating electronic components is formed between the handle body and the cover.

A capacitive proximity sensor is arranged in the accommodating space, wherein the proximity sensor has an active capacitive face, directed towards the cover, for detecting approaching movements, wherein the approaching movements can be detected through the cover.

In order to detect approaching movements, the capacitive face is coupled to an evaluation circuit which detects changes in the capacitance of the capacitive face. A sealing means composed of a closed-cell foam is arranged in the accommodating space, wherein the sealing means has a continuous opening which is spaced apart from the edge of the sealing means.

The sealing means is arranged with a continuous opening above the active face of the proximity sensor, so that at least one area above the active face of the proximity sensor is free of foam. The sealing means is compressed in a sealing manner between the cover and the handle body or between the cover and the components accommodated in the handle body.

In accordance with the invention, it is proposed, in the case of a handle device of the initially mentioned type to insert an elastic seal which has a continuous free opening inside. This means that the elastic sealing material extends annularly and on all sides around the free opening. The inside free opening is arranged above the active face of the capacitive presence detection sensor. The elastic seal is dimensioned in its thickness dimension, thus in the direction between the capacitive sensor and the cover, such that it is compressed in the case of placement of the cover above the capacitive sensor arrangement. The thickness dimension of the seal is thus larger in the uncompressed state than the space occupied by the seal in installed end state.

The elastic sealing material is a closed-cell foam that acts in a sealing manner vis-à-vis fluids, fats and other foreign substances.

Thus, in accordance with the invention on the one hand the elastic properties of the foam are used to provide a sealing connection between the cover of the door handle arrangement and the sensor device. This happens by compressing the foam during installation and so that it occupies the sealing position under a certain pre-tensioning. Also, in this way temperature fluctuations cannot lead to the release of gap openings.

In addition, the formation of an annular seal with a free interior above the active face of the capacitive sensor is suitable for improving the detection accuracy of the sensor arrangement. Since in the free area, to the greatest extent constant conditions prevail, a recalibration is only required for those conditions that originate outside the door handle arrangement. The particularly sensitive area directly above the active detection face will be protected from damaging influences by the inventive all around seal.

The improvement of the detection accuracy eventually results again in a lessening of the energy requirements of the detection device.

Any sealing foam available on the market can be used as a sealing foam, e.g. vinyl foams, which offer a good seal against moisture. A continuous opening is to be introduced in such foams, e.g. by blanking or cutting, said opening being placed above the active face of the capacitive sensor device.

The capacitive sensor arrangement is equipped with a sensor electrode, with whose help the approaching movement of an object is detected. The control and evaluation circuit detects a change of the capacity of the sensor electrode vis-à-vis mass by periodically repeatedly coupling the sensor electrode at a predefined frequency with an operating voltage and evaluating at least one parameter of a current or voltage flow dependent on the periodic charging and discharging of the sensor electrode for the detection of the capacity change (see e.g. U.S. Pat. No. 5,730,165 or DE 19681725). The parameter of a current or voltage flow dependent on the periodic charging and discharging of the sensor electrode is in the process a voltage that can be measured via a capacitor which depends on the charge accumulated on the capacitor, wherein this charge is accumulated as a result of the periodically the sensor electrode is repeatedly charged by coupling with the operating voltage and subsequently is discharged by coupling with the capacitor.

In this context, it is to be noted that the arrangement of the sealing foam takes place such that no disturbing influences can penetrate. This is not to say that the sealing foam is placed directly on the active face, e.g. the electrode face of the capacitive sensor arrangement. Since capacitive sensor arrangements are often cast in insulating material, the seal can also be arranged on the grouting material for sealing this cast system against the outer covers. What is important is only that the foam is installed in this area under tension and the inner free area is placed above the active face of the capacitive sensor arrangement.

In one advantageous further development of the invention a hygroscopic material is installed in the inner free space of the foam as absorption material.

In order to extract the residual moisture from the inner free area, which is sealed surrounded by foam, a hygroscopic material is introduced into the inner free area. This material can be applied, injected or otherwise deposited.

In one preferred further development of the invention silica gel is installed into the inner free area prior to the installation of the outer cover. Silica gel is a well-known material for preventing the formation of condensation-moisture. Simultaneously, in the event of absorbed moisture such absorption means acts such that constant conditions for detection remain present. The moisture is bound in the absorption means. Correspondingly a calibration can be permanently adapted to these conditions. Moreover, the introduction of such absorption means reduces the influences on the areas in which the absorption means is arranged. For example, if beads of silica gel are installed, the influence of the detection range of a capacitive sensor arrangement is significantly reduced. The detection system can be calibrated with running comparison measurements to a permanent and unchanged influence, for example through absorption means with an absorbing material (water). Since, moreover the development of conducting films, e.g. through fluids is prevented above the sensor, the sensitivity remains without essential impairment.

BRIEF DESCRIPTION OF THE DRAWINGS

The invention will now be described in greater detail with the help of the accompanying figures.

DETAILED DESCRIPTION

Figure 1:
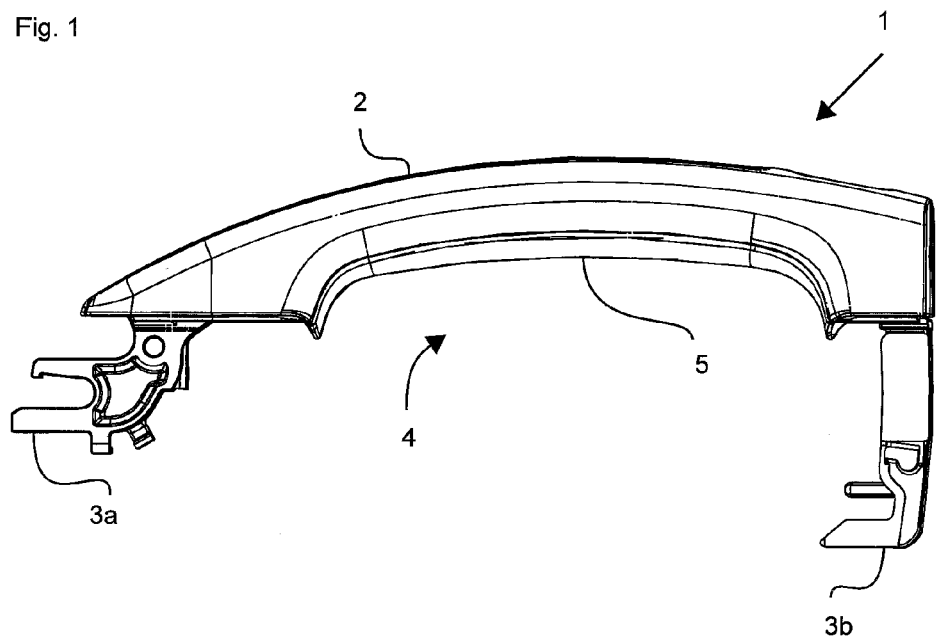
FIG. 1 shows a lateral view of an installed door handle.

FIG. 1 shows a door handle that is provided for installation on a motor vehicle. The door handle has a cover 2 which is placed upon a handle body 5. Actuating sections 3a and 3b are shown. These sections 3a and 3b are inserted through associated openings in the door panel door in the installation on the vehicle and enter into interaction with the mechanical closing components in the door.

The door handle is formed such that an area 4 for engagement of the door handle is developed, wherein the cover 2 forms a handle together with a handle body.

Figure 2:
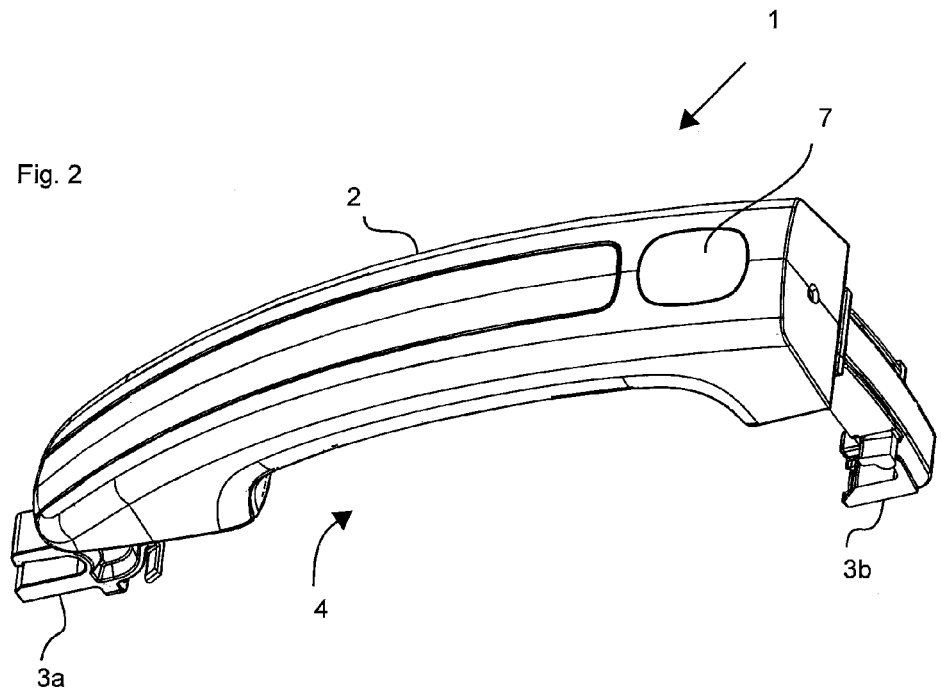
FIG. 2 shows the door handle from FIG. 1 in a diagonal view.

FIG. 2 shows the door handle from a diagonal view, so that the cover 2 can be clearly recognized with its side facing a user. Moreover, an actuation area 7 is shown, which is positioned in the area of the thumb actuation in the installation on the vehicle. A vehicle function can be triggered via the interaction with this actuation area 7.

Figure 3A:
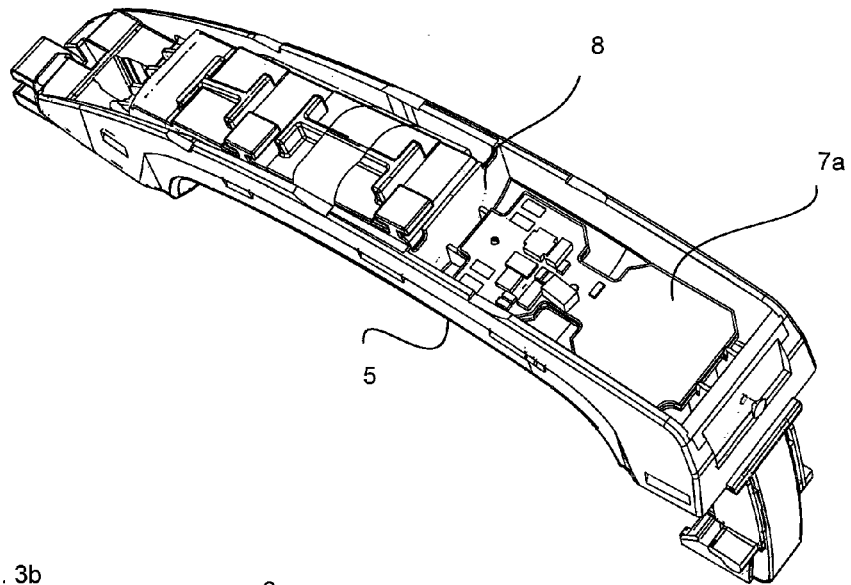
FIG. 3a shows the door handle from FIGS. 1 and 2 without the cover and with electronic components.

Various types of electronic assemblies can be arranged in the door handle 1, in particular sensors and antenna arrangements. In FIG. 3a the door handle is shown in a diagonal view, wherein the cover 2 is removed. Various electronic assemblies are arranged in the handle body 5. In particular, a capacitive sensor arrangement 7a is arranged in the area behind the actuation area 7 in the handle. The approaching movement of a body part, e.g. of a thumb in the area 7 is detected through the sensor arrangement 7a lying underneath. In this way, for example a central locking system for locking a parked vehicle can be actuated.

Figure 3B:
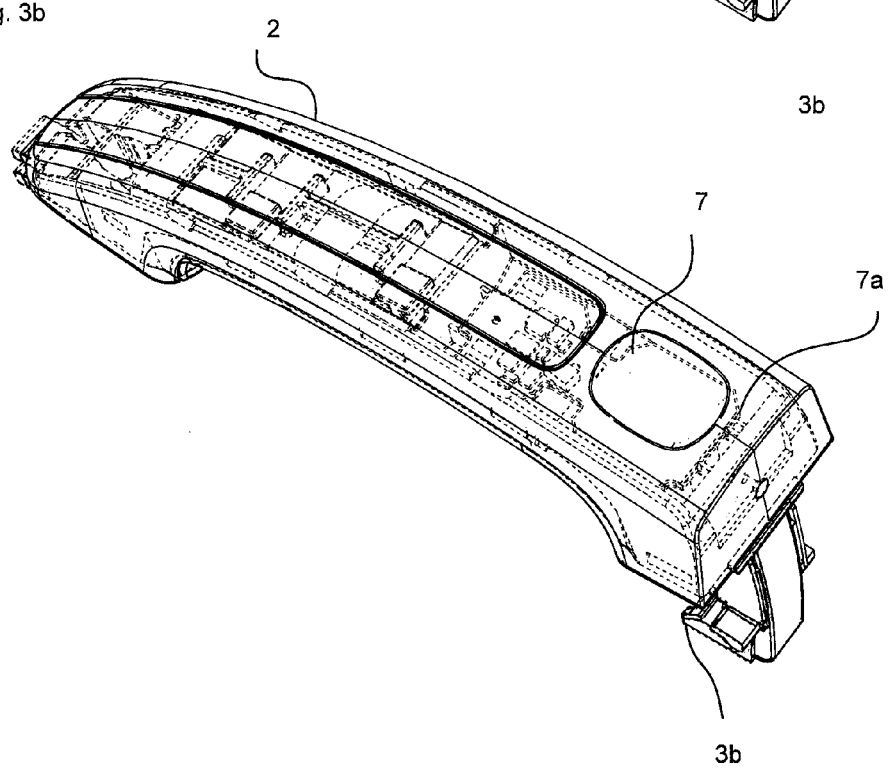
FIG. 3b shows the door handle from FIGS. 1 and 2 with a transparent cover and with electronic components.

By showing the cover 2 and the covered areas in broken lines, FIG. 3b indicates that the sensor arrangement 7a lies under the actuation area 7.

Figure 4:
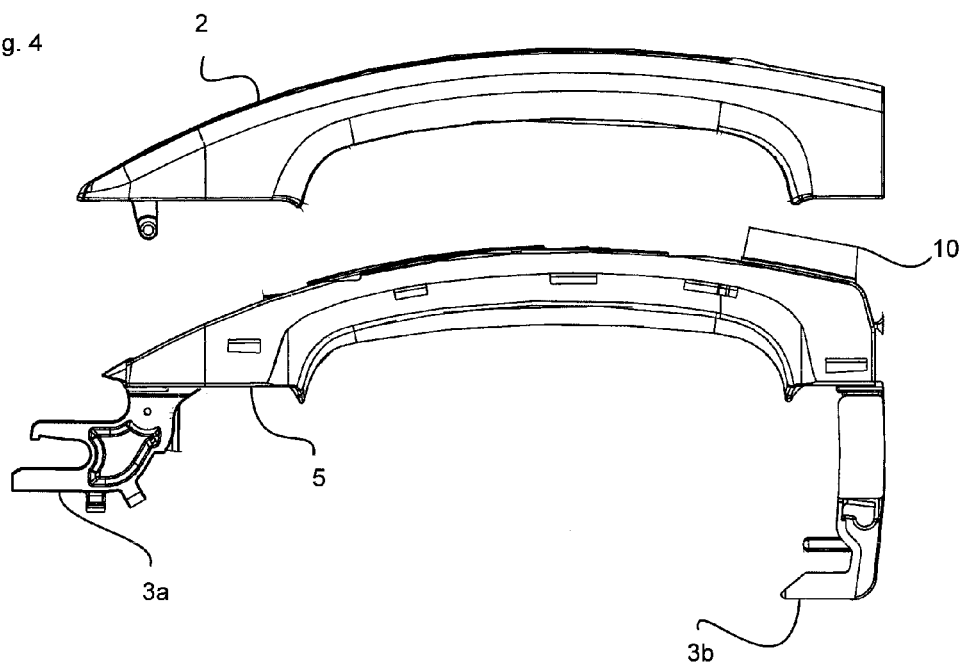
FIG. 4 shows the door handle from FIGS. 1 and 2 with a moved away cover in a lateral view.

FIG. 4 shows the handle arrangement of FIGS. 1, 2 and 3b, wherein the cover 2 is moved away from the handle carrier 5 in this representation. By using several components to encompass the electronic components accommodated in the handle, the handle interior is never completely enclosed. Humidity and rain as well as dust and liquid vapors can penetrate into the handle, between the handle carrier 5 and the cover 2. It is evident that such penetrating substances can reach under the actuation face 7 and influence a capacitive sensor 7a accommodated in the handle carrier 5.

Thus, in FIG. 4 the inventive seal 10 is shown which is compressed between the handle cover 2 and the handle carrier 5 in order to seal the area below the cover 7, thus the area between housing 2 and the capacitive sensor arrangement. As can be better recognized in FIG. 5, the handle body 5 has a partition 8 in the interior which separates a function section in the interior of the handle carrier 5 from an accommodation area for other components.

Figure 5:
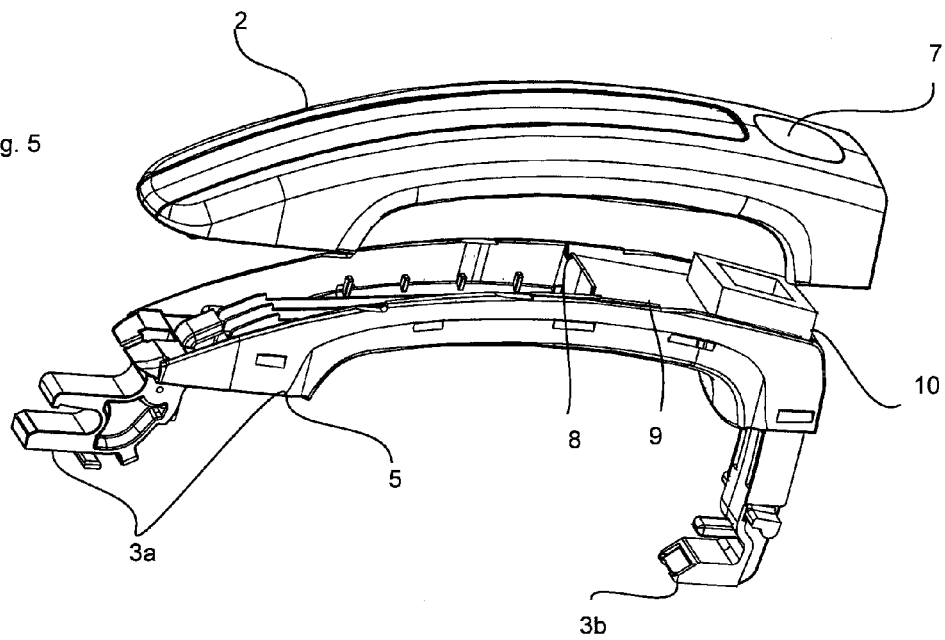
FIG. 5 shows the door handle arrangement from FIG. 4 in a diagonal view.

To illustrate the inner structure, the electronic components are not shown in FIG. 5. The capacitive sensor arrangement 7a is arranged in the separate area (see FIGS. 3a and 3b), said sensor arrangement being cast with a sealing compound 9. In accordance with the invention, the sealing frame 10 is arranged on this sealing compound. The frame is placed with an inner free opening above the active sensor face of the capacitive sensor. The sensor cannot be recognized in this representation, since it is covered by the sealing compound 9.

Through this inventive arrangement on the one hand, the sensitivity of the capacitive sensor is not negatively influenced by the seal 10, on the other hand, the detection range of the sensor electrodes is kept free from the penetration of substances.

Absorbing material is deposited in the inner opening of the sealing material 10, e.g. beads of silica gel.

The foam of the sealing body 10 is a closed-cell foam which prevents the penetration and passing through of fluids and gases. The foam is in other respects provided with a one-sided self-adhesive surface that permits easy positioning and attachment. This foam is so elastic that it is compressed between the cover 2 and handle body 5 in the case of their connection, in the process a sealing contact forms between sealing compound 9 and cover 2. The foam is in the process so flexible that it does not elicit any return forces hindering disassembly.

The invention claimed is:

1. A door handle device for motor vehicles with a handle body and a cover for the handle body, wherein the handle body and the cover form a handle for a user, wherein an accommodating space for accommodating electronic components is formed between the handle body and the cover, the door handle device comprising:
 a capacitive proximity sensor which is arranged in the accommodating space, wherein the proximity sensor has an active capacitive face directed towards the cover to detect approaching movements, wherein the approaching movements can be detected through the cover,
 wherein for the detection of approaching movements, the capacitive face is coupled to an evaluation circuit which detects changes in the capacitance of the capacitive face,
 wherein a sealing member comprising a closed-cell foam is arranged in the accommodating space, wherein the sealing member has at least one continuous opening which is spaced apart from an edge of the sealing member,
 wherein the at least one continuous opening of the sealing member is arranged above the active face of the proximity sensor, so that at least one area above the active face of the proximity sensor is free of the closed-cell foam and wherein the sealing member is compressed in a sealing manner between the cover and the handle body or between the cover and the components accommodated in the handle body.

2. The door handle device according to claim 1, wherein the capacitive proximity sensor is cast with an electrically insulating sealing compound and wherein the sealing member is compressed between the sealing compound and the cover.

3. The door handle device according to claim 2, wherein in at least one of the openings in the sealing member a drying agent, in particular silica gel is deposited.

4. The door handle device according to claim 2, wherein the sealing member only seals one area surrounding the capacitive proximity sensor, thus extending above a section of the accommodating space.

5. The door handle device according to claim 2, wherein the sealing member is constructed in multiple layers, wherein the layers of the sealing member coming into contact with the cover are softer than the rest of the layers.

6. The door handle device according to claim 1, wherein in at least one of the openings in the sealing member a drying agent, in particular silica gel is deposited.

7. The door handle device according to claim 6, wherein the sealing member only seals one area surrounding the capacitive proximity sensor, thus extending above a section of the accommodating space.

8. The door handle device according to claim 6, wherein the sealing member is constructed in multiple layers, wherein the layers of the sealing member coming into contact with the cover are softer than the rest of the layers.

9. The door handle device according to claim 1, wherein the sealing member only seals one area surrounding the capacitive proximity sensor, thus extending above a section of the accommodating space.

10. The door handle device according to claim 9, wherein the sealing member is constructed in multiple layers, wherein the layers of the sealing member coming into contact with the cover are softer than the rest of the layers.

11. The door handle device according to claim 1, wherein the sealing member is constructed in multiple layers, wherein the layers of the sealing member coming into contact with the cover are softer than the rest of the layers.

* * * * *